US011166370B2

United States Patent
Koga et al.

(10) Patent No.: US 11,166,370 B2
(45) Date of Patent: Nov. 2, 2021

(54) RESIN COMPOSITION, PREPREG, METAL FOIL-CLAD LAMINATE, RESIN SHEET, AND PRINTED WIRING BOARD

(71) Applicant: Mitsubishi Gas Chemical Company, Inc., Tokyo (JP)

(72) Inventors: Shota Koga, Tokyo (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/480,088

(22) PCT Filed: Jan. 19, 2018

(86) PCT No.: PCT/JP2018/001624
§ 371 (c)(1),
(2) Date: Jul. 23, 2019

(87) PCT Pub. No.: WO2018/139368
PCT Pub. Date: Aug. 2, 2018

(65) Prior Publication Data
US 2020/0196443 A1    Jun. 18, 2020

(30) Foreign Application Priority Data

Jan. 26, 2017    (JP) .............................. JP2017-012365

(51) Int. Cl.
*C08L 75/14*    (2006.01)
*H05K 1/03*    (2006.01)
*C08J 5/18*    (2006.01)
*C08L 63/00*    (2006.01)

(52) U.S. Cl.
CPC .............. *H05K 1/0366* (2013.01); *C08J 5/18* (2013.01); *C08L 63/00* (2013.01); *C08L 75/14* (2013.01)

(58) Field of Classification Search
CPC ......... C09J 163/00; C08F 36/06; C08L 53/02; C08L 47/00
See application file for complete search history.

(56) References Cited

U.S. PATENT DOCUMENTS

| 4,403,073 A | 9/1983 | Ikeguchi |
| 4,410,601 A * | 10/1983 | Gaku ................ C08G 59/4042 |
| | | 442/158 |
| 4,780,507 A * | 10/1988 | Gaku ..................... C08G 59/12 |
| | | 428/417 |
| 2005/0277743 A1 | 12/2005 | Nozaki et al. |
| 2010/0233495 A1* | 9/2010 | Mizuno .................... C08L 71/12 |
| | | 428/462 |
| 2014/0377565 A1 | 12/2014 | Kobayashi et al. |
| 2015/0035730 A1 | 2/2015 | Huang et al. |
| 2015/0126684 A1 | 5/2015 | Das et al. |
| 2016/0125972 A1 | 5/2016 | Arii et al. |
| 2016/0345433 A1 | 11/2016 | Arii et al. |

FOREIGN PATENT DOCUMENTS

| CN | 106349643 A | 1/2017 |
| DE | 3117903 | 2/1982 |
| JP | 56-98244 | 8/1981 |
| JP | 56-141310 | 11/1981 |
| JP | 56-157425 | 12/1981 |
| JP | 57-143350 | 9/1982 |
| JP | 57-153046 | 9/1982 |
| JP | S58-164638 | 9/1983 |
| JP | 4-366146 | 12/1992 |
| JP | 6-192478 | 7/1994 |
| JP | 2841747 | 12/1998 |
| JP | 2006-022309 | 1/2006 |
| JP | 2009-1783 | 1/2009 |
| JP | 2014-37485 | 2/2014 |
| JP | 2016-537496 | 12/2016 |
| JP | 2017-177469 | 10/2017 |
| KR | 2016/0118229 | 10/2016 |
| WO | 2013/065694 | 5/2013 |
| WO | 2014/203866 | 12/2014 |

OTHER PUBLICATIONS

International Search Report issued in International Patent Application No. PCT/JP2018/001624, dated Apr. 3, 2018 with English Translation.
International Preliminary Report on Patentability in International Patent Application No. PCT/JP2018/001624, dated Jul. 30, 2019 with English translation.
Reasons for Refusal, Japanese Patent Application No. 2018-525625, dated Sep. 21, 2018 (with English translation).
Decision to Grant a Patent, Japanese Patent Application No. 2018-525625, dated Jan. 21, 2019 (with English translation).

* cited by examiner

*Primary Examiner* — Gregory Listvoyb
(74) *Attorney, Agent, or Firm* — Greenblum & Bernstein, P.L.C.

(57) ABSTRACT

A resin composition according to the present invention contains: (i) a reactant of a cyanate compound (A) and polybutadiene (B) and/or (ii) a reactant of a polymerized product of the cyanate compound (A) and the polybutadiene (B); and a maleimide compound (C).

14 Claims, No Drawings

RESIN COMPOSITION, PREPREG, METAL FOIL-CLAD LAMINATE, RESIN SHEET, AND PRINTED WIRING BOARD

This application claims the priority based on Japanese Patent Application No. 2017-012365 filed on Jan. 26, 2017, the contents of which are incorporated herein by reference.

TECHNICAL FIELD

The present invention relates to a resin composition, a prepreg, a metal foil-clad laminate, a resin sheet and a printed wiring board.

BACKGROUND ART

In recent years, higher integration and miniaturization of semiconductors widely used in electronic equipment, communication instruments, personal computers, and the like have accelerated increasingly. With this, various characteristics required for laminates for semiconductor packages used in printed wiring boards have become increasingly strict. Examples of the required characteristics include characteristics such as low water absorbency, moisture absorption heat resistance, flame retardancy, a low dielectric constant, a low dielectric loss tangent, a low thermal expansion coefficient, heat resistance, chemical resistance, and high plating peel strength. But, these required characteristics have not always been satisfied so far.

Conventionally, as resins for printed wiring boards having excellent heat resistance and electrical characteristics, cyanate compounds are known, and in recent years, resin compositions using cyanate compounds in combination with epoxy resins, bismaleimide compounds, and the like have been widely used for materials for highly functional printed wiring boards such as for semiconductor plastic packages, and the like.

For example, in Patent Literatures 1 and 2, resin compositions, which contains a cyanate compound and an epoxy resin that have excellent characteristics such as adhesiveness, low water absorbency, moisture absorption heat resistance, and insulation reliability, are proposed.

CITATION LIST

Patent Literature

Patent Literature 1: International Publication No. WO 2013/065694
Patent Literature 2: International Publication No. WO 2014/203866

SUMMARY OF INVENTION

Technical Problem

However, in the above conventional art, there is still room for study in terms of excellent dielectric characteristics and moreover also excellent heat resistance.

The present invention has been made in view of the above problem, and an object of the present invention is to provide a resin composition having excellent dielectric characteristics and also excellent heat resistance, and a prepreg, a metal foil-clad laminate, a resin sheet, and a printed wiring board using the resin composition.

Solution to Problem

The present inventors have diligently studied in order to solve the above problem. As a result, the present inventors have found that the above problem can be solved by using a cyanate compound, polybutadiene, and a maleimide compound in combination, leading to completion of the present invention.

Specifically, the present invention is as follows.

[1]

A resin composition comprising:

(i) a reactant of a cyanate compound (A) and polybutadiene (B) and/or (ii) a reactant of a polymerized product of the cyanate compound (A) and the polybutadiene (B); and a maleimide compound (C).

[2]

The resin composition according to [1], wherein the cyanate compound (A) comprises at least one cyanate compound (A1) selected from a group consisting of a bisphenol A-based cyanate compound, a bisphenol E-based cyanate compound, a bisphenol F-based cyanate compound, and a novolac-based cyanate compound.

[3]

The resin composition according to [2], wherein the cyanate compound (A) further comprises a cyanate compound (A2) other than the cyanate compound (A1).

[4]

The resin composition according to [2] or [3], wherein an amount of the polybutadiene (B) is 5 to 30 parts by mass based on 100 parts by mass of the cyanate compound (A1).

[5]

The resin composition according to any of [1] to [4], wherein the polybutadiene (B) comprises a 1,2-adduct and a 1,4-adduct at a mass ratio of 1:3 to 3:1.

[6]

The resin composition according to any one of [1] to [5], wherein a content of the cyanate compound (A) in the resin composition is 1 to 90 parts by mass based on 100 parts by mass of resin solid components.

[7]

The resin composition according to any one of [1] to [6], wherein the maleimide compound (C) comprises at least one selected from a group consisting of 2,2'-bis{4-(4-maleimidophenoxy)-phenyl}propane, bis(3-ethyl-5-methyl-4-maleimidophenyl)methane, a maleimide compound (C1) represented by the following formula (1-1), and a maleimide compound (C2) represented by the following formula (1-2),

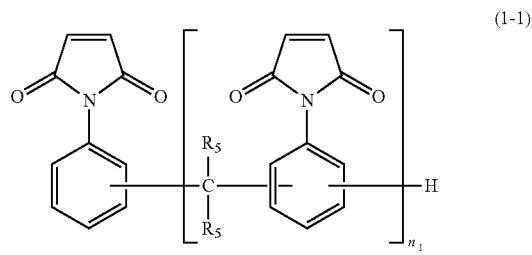

wherein $R_5$ each independently represents a hydrogen atom or a methyl group, and $n_1$ represents an integer of 1 or more,

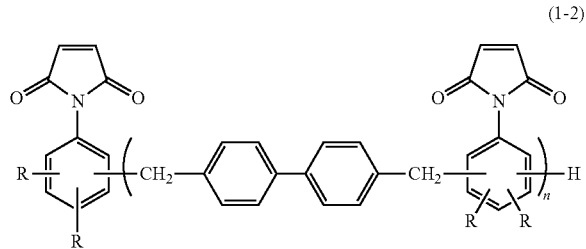

(1-2)

wherein a plurality of R each independently represent a hydrogen atom, an alkyl group having 1 to 5 carbon atoms, or a phenyl group, and n is an average value and satisfies $1 < n \le 5$.

[8]

The resin composition according to any one of [1] to [7], wherein the maleimide compound (C) contains at least one selected from a group consisting of bis(3-ethyl-5-methyl-4-maleimidophenyl) methane, a maleimide compound (C1) represented by the following formula (1-1), and a maleimide compound (C2) represented by the following formula (1-2),

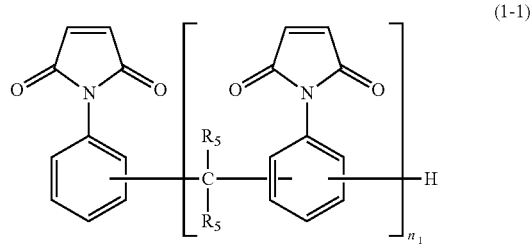

(1-1)

wherein $R_5$ each independently represents a hydrogen atom or a methyl group, and $n_1$ represents an integer of 1 or more,

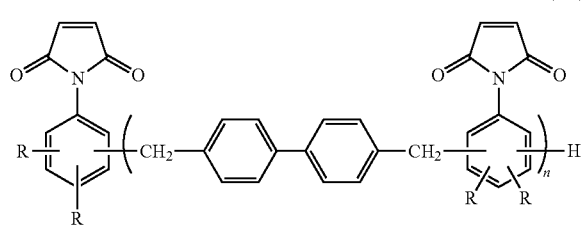

(1-2)

wherein a plurality of R each independently represent a hydrogen atom, an alkyl group having 1 to 5 carbon atoms, or a phenyl group, and n is an average value and satisfies $1 < n \le 5$.

[9]

The resin composition according to any one of [1] to [8], further comprising a filler (D).

[10]

The resin composition according to [9], wherein a content of the filler (D) in the resin composition is 50 to 1600 parts by mass based on 100 parts by mass of the resin solid components.

[11]

The resin composition according to any one of [1] to [10], further comprising any one or more of a group selected from an epoxy resin, a phenolic resin, an oxetane resin, a benzoxazine compound, and a compound having a polymerizable unsaturated group.

[12]

A prepreg comprising:
a base material; and
the resin composition according to any one of [1] to [11], with which the base material is impregnated or coated.

[13]

A metal foil-clad laminate comprising:
at least one or more of the prepregs according to [12] laminated; and
a metal foil disposed on one surface or both surfaces of the prepreg.

[14]

A resin sheet comprising the resin composition according to any one of [1] to [11].

[15]

A printed wiring board comprising:
an insulating layer; and
a conductor layer formed on a surface of the insulating layer, wherein
the insulating layer comprises the resin composition according to any one of [1] to [11].

Advantageous Effect of Invention

According to the present invention, a resin composition, a prepreg, a metal foil-clad laminate, a resin sheet, and a printed wiring board having excellent dielectric characteristics and also excellent heat resistance can be provided.

DESCRIPTION OF EMBODIMENT

An embodiment for carrying out the present invention (hereinafter referred to as "the present embodiment") will be described in detail below, but the present invention is not limited to this, and various modifications can be made without departing from the spirit thereof.

A resin composition of the present embodiment comprises (i) the reactant of a cyanate compound (A) and polybutadiene (B), and/or (ii) the reactant of a polymerized product of the cyanate compound (A) and the polybutadiene (B). Further, the resin composition of the present embodiment comprises a maleimide compound (C). The resin composition of the present embodiment is arranged in this manner and therefore has excellent dielectric characteristics and also excellent heat resistance.

Components constituting the resin composition of the present embodiment will be described below.

[Cyanate Compound (A)]

The cyanate compound (A) is not particularly limited as long as it is a compound having in the molecule an aromatic moiety substituted by at least one cyanato group (cyanate group). The resin composition using the cyanate compound (A) has characteristics excellent in glass transition temperature, low thermal expansion properties, plating adhesiveness, and the like when formed into a cured product.

Examples of the cyanate compound (A) include, but are not limited to, one represented by the following formula (2):

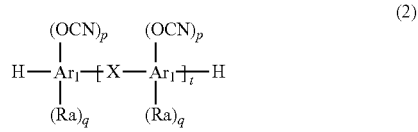

(2)

wherein $Ar_1$ represents a benzene ring, a naphthalene ring, or two benzene rings bonded to each other via a single bond.

When there are a plurality of $Ar_1$, $Ar_1$ may be the same as or different from each other. Ra each independently represents a hydrogen atom, an alkyl group having 1 to 6 carbon atoms, an aryl group having 6 to 12 carbon atoms, an alkoxyl group having 1 to 4 carbon atoms, or a group in which an alkyl group having 1 to 6 carbon atoms and an aryl group having 6 to 12 carbon atoms are bonded to each other. The aromatic ring for Ra may have a substituent, and any position can be selected for the substituents in $Ar_1$ and Ra. p represents the number of cyanato groups bonded to $Ar_1$ and is each independently an integer of 1 to 3. q represents the number of Ra bonded to $Ar_1$ and is 4−p when $Ar_1$ is a benzene ring, 6−p when $Ar_1$ is a naphthalene ring, and 8−p when $Ar_1$ is two benzene rings bonded to each other via a single bond. t represents the average number of repetitions and is in the range of 0 to 50, and the cyanate compound may be a mixture of compounds having different t. X represents any of a single bond, a divalent organic group having 1 to 50 carbon atoms (a hydrogen atom may be replaced by a heteroatom), a divalent organic group having 1 to 10 nitrogen atoms (for example, —N—R—N— (wherein R represents an organic group)), a carbonyl group (—CO—), a carboxy group (—C(=O)O—), a carbonyl dioxide group (—OC(=O)O—), a sulfonyl group (—$SO_2$—), a divalent sulfur atom, or a divalent oxygen atom, and X is each independently as defined above when there are a plurality of X.

The alkyl group for Ra in the above formula (2) may have either of a linear or branched chain structure and a cyclic structure (for example, a cycloalkyl group).

In addition, a hydrogen atom in the alkyl group and the aryl group for Ra in formula (2) may be replaced by a halogen atom such as a fluorine atom or a chlorine atom, an alkoxyl group such as a methoxy group or a phenoxy group, a cyano group, or the like.

Specific examples of the alkyl group include, but are not limited to, a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the aryl group include, but are not limited to, a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluoromethyl group, a methoxyphenyl group, and an o-, m-, or p-tolyl group.

Examples of the alkoxyl group include, but are not limited to, a methoxy group, an ethoxy group, a propoxy group, an isopropoxy group, an n-butoxy group, an isobutoxy group, and a tert-butoxy group.

Specific examples of the divalent organic group having 1 to 50 carbon atoms for X in the above formula (2) include, but are not limited to, a methylene group, an ethylene group, a trimethylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the divalent organic group may be replaced by a halogen atom such as a fluorine atom or a chlorine atom, an alkoxyl group such as a methoxy group or a phenoxy group, a cyano group, or the like.

Examples of the divalent organic group having 1 to 10 nitrogen atoms for X in the above formula (2) include, but are not limited to, an imino group and a polyimide group.

In addition, examples of the organic group of X in the above formula (2) include one having a structure represented by the following formula (3) or the following formula (4).

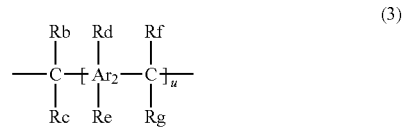

wherein $Ar_e$ represents a benzenetetrayl group, a naphthalenetetrayl group, or a biphenyltetrayl group, and may be the same as or different from each other when u is 2 or more; Rb, Rc, Rf, and Rg each independently represent a hydrogen atom, an alkyl group having 1 to 6 carbon atoms, an aryl group having 6 to 12 carbon atoms, a trifluoromethyl group, or an aryl group having at least one phenolic hydroxy group; Rd and Re are each independently selected from any one of a hydrogen atom, an alkyl group having 1 to 6 carbon atoms, an aryl group having 6 to 12 carbon atoms, an alkoxyl group having 1 to 4 carbon atoms, or a hydroxy group; and u represents an integer of 0 to 5.

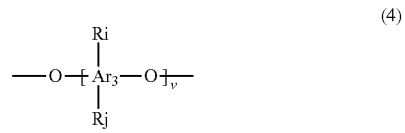

wherein $Ar_3$ represents a benzenetetrayl group, a naphthalenetetrayl group, or a biphenyltetrayl group, and may be the same as or different from each other when v is 2 or more; Ri and Rj each independently represent a hydrogen atom, an alkyl group having 1 to 6 carbon atoms, an aryl group having 6 to 12 carbon atoms, a benzyl group, an alkoxyl group having 1 to 4 carbon atoms, a hydroxy group, a trifluoromethyl group, or an aryl group substituted by at least one cyanato group; and v represents an integer of 0 to 5, and the cyanate compound may be a mixture of compounds having different v.

Further, examples of X in formula (2) include divalent groups represented by the following formulas:

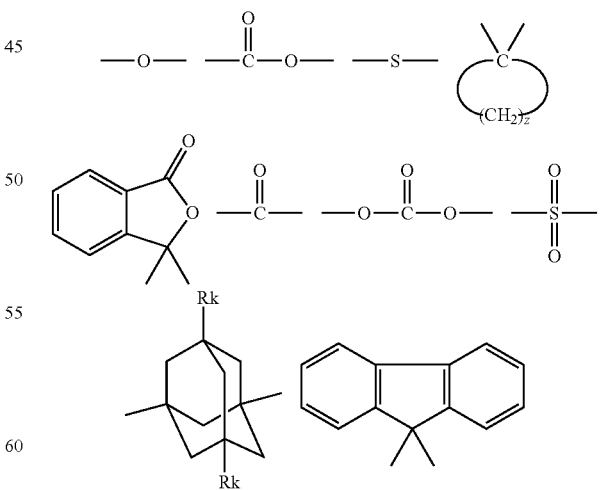

wherein z represents an integer of 4 to 7; and Rk each independently represents a hydrogen atom or an alkyl group having 1 to 6 carbon atoms.

Specific examples of $Ar_2$ in formula (3) and $Ar_a$ in formula (4) include a benzenetetrayl group to which two carbon atoms shown in formula (3) or two oxygen atoms shown in formula (4) are bonded at positions 1 and 4 or positions 1 and 3, a biphenyltetrayl group to which the above two carbon atoms or two oxygen atoms are bonded at positions 4 and 4', positions 2 and 4', positions 2 and 2', positions 2 and 3', positions 3 and 3', or positions 3 and 4', and a naphthalenetetrayl group to which the above two carbon atoms or two oxygen atoms are bonded at positions 2 and 6, positions 1 and 5, positions 1 and 6, positions 1 and 8, positions 1 and 3, positions 1 and 4, or positions 2 and 7.

The alkyl group and the aryl group for Rb, Rc, Rd, Re, Rf, and Rg in formula (3) and Ri and Rj in formula (4) have the same meanings as those in the above formula (2).

Specific examples of the cyanato-substituted aromatic compound represented by the above formula (2) include, but are not limited to, cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanaphenyl)-2-phenylpropane (a cyanate of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis (4-cyanatophenyl) ether, bis(4-cyanatophenyl) sulfide, bis (4-cyanatophenyl) sulfone, 4-cyanatobenzoic acid-4-cyanatophenyl ester (4-cyanatophenyl-4-cyanatobenzoate), bis-(4-cyanatophenyl) carbonate, 1,3-bis(4-cyanatophenyl)adamantane, 1,3-bis(4-cyanatophenyl)-5,7-dimethyladamantane, 3,3-bis(4-cyanatophenyl)isobenzofuran-1(3H)-one (a cyanate of phenolphthalein), 3,3-bis(4-cyanato-3-methylphenyl)isobenzofuran-1(3H)-one (a cyanate of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene) diphthalimide, tris(3,5-dimethyl-4-cyanatobenzyl) isocyanurate, 2-phenyl-3,3-bis(4-cyanatophenyl)phthalimidine, 2-(4-methylphenyl)-3,3-bis(4-cyanatophenyl)phthalimidine, 2-phenyl-3,3-bis(4-cyanato-3-methylphenyl) phthalimidine, 1-methyl-3,3-bis(4-cyanatophenyl)indolin-2-one, and 2-phenyl-3,3-bis(4-cyanatophenyl)indolin-2-one.

In addition, other specific examples of the compound represented by the above formula (2) include, but are not limited to, those obtained by cyanation of phenolic resins such as phenol novolac resins and cresol novolac resins (those obtained by reacting a phenol, an alkyl-substituted phenol, or a halogen-substituted phenol and a formaldehyde compound such as formalin or paraformaldehyde in an acidic solution by a known method), trisphenol novolac resins (those obtained by reacting hydroxybenzaldehyde and a phenol in the presence of an acidic catalyst), fluorene novolac resins (those obtained by reacting a fluorenone compound and a 9,9-bis(hydroxyaryl)fluorene in the presence of an acidic catalyst), phenol aralkyl resins, cresol aralkyl resins, naphthol aralkyl resins, and biphenyl aralkyl resins (those obtained by reacting a bishalogenomethyl compound as represented by $Ar_4—(CH_2Y)_2$ ($Ar_4$ represents a phenyl group, and Y represents a halogen atom; and the same applies below in this paragraph) and a phenol compound with an acidic catalyst or without a catalyst by a known method, those obtained by reacting a bis(alkoxymethyl) compound as represented by $Ar_4—(CH_2OR)_2$ and a phenol compound in the presence of an acidic catalyst by a known method, or those obtained by reacting a bis(hydroxymethyl) compound as represented by $Ar_4—(CH_2OH)_2$ and a phenol compound in the presence of an acidic catalyst by a known method, or those obtained by polycondensing an aromatic aldehyde compound, an aralkyl compound, and a phenol compound by a known method), phenol-modified xylene formaldehyde resins (those obtained by reacting a xylene formaldehyde resin and a phenol compound in the presence of an acidic catalyst by a known method), modified naphthalene formaldehyde resins (those obtained by reacting a naphthalene formaldehyde resin and a hydroxy-substituted aromatic compound in the presence of an acidic catalyst by a known method), and phenol-modified dicyclopentadiene resins, and phenolic resins having a polynaphthylene ether structure (those obtained by subjecting a polyvalent hydroxynaphthalene compound having two or more phenolic hydroxy groups in one molecule to dehydration condensation in the presence of a basic catalyst by a known method) by a method similar to the above, and prepolymers thereof.

One of the above-described cyanate compound (A) can be used alone, or two or more of the above-described cyanate compounds (A) can be mixed and used.

Among the above-described cyanate compounds (A), bisphenol A-based cyanate compounds, bisphenol E-based cyanate compounds, bisphenol F-based cyanate compounds, and novolac-based cyanate compounds are preferred, and bisphenol A-based cyanate compounds are especially preferred. In other words, in the present embodiment, the cyanate compound (A) preferably comprises at least one cyanate compound (A1) selected from the group consisting of a bisphenol A-based cyanate compound, a bisphenol E-based cyanate compound, a bisphenol F-based cyanate compound, and a novolac-based cyanate compound.

A cyanate compound other than the cyanate compound (A1) is also referred to herein as a "cyanate compound (A2)". In the present embodiment, the cyanate compound (A) preferably comprises the cyanate compound (A2) in addition to the cyanate compound (A1).

The content of the cyanate compound (A) can be appropriately set according to the desired characteristics and is not particularly limited but is preferably 1 to 90 parts by mass, more preferably 30 to 70 parts by mass, and further preferably 40 to 60 parts by mass, based on 100 parts by mass of the resin solid components from the viewpoint of obtaining a cured product having a lower thermal expansion coefficient.

In the present embodiment, the "resin solid components" refers to components in the resin composition of the present embodiment excluding a solvent and a filler unless otherwise noted, and "100 parts by mass of resin solid components" refers to the total of the components in the resin composition of the present embodiment, excluding the solvent and the filler, being 100 parts by mass.

[Polybutadiene (B)]

It is considered that the polybutadiene (B) used in the present embodiment contributes to improvement of dielectric characteristics because of its low polarity. In the present embodiment, from the viewpoint of making dielectric characteristics sufficiently low, unmodified polybutadiene (B) is used. In the present embodiment, "unmodified polybutadiene" means polybutadiene not modified with a polar group. Here, the polar group is a functional group that influences dielectric characteristics. Examples of the polar group include a phenol group, an amino group, and an epoxy group. The polybutadiene (B) is not particularly limited, and, for example, 1,2-polybutadiene and 1,4-polybutadiene can be used.

In addition, as the polybutadiene (B), homopolymers of butadiene in which 50% or more of the butadiene units in the polymer chain are 1,2-bonds, and derivatives thereof can also be used. Specific examples of such polybutadiene (B) include, but are not limited to, NISSO PB B-1000, NISSO PB B-2000, NISSO PB B-3000, NISSO PB G-1000, NISSO PB G-2000, NISSO PB G-3000, and NISSO PB C-1000, and GI-1000 and GI-3000 (hydrogenated modified products), which are derivatives thereof, commercially available from Nippon Soda Co., Ltd.

In the present embodiment, from the viewpoint of exhibiting better dielectric characteristics, the polybutadiene (B) preferably contains the 1,2-adduct and the 1,4-adduct at a mass ratio of 1:3 to 3:1. In addition, from the viewpoint of exhibiting particularly good dielectric characteristics, the above mass ratio is more preferably 1:1 to 3:1, further preferably 1:1 to 2:1.

In the present embodiment, "contains the 1,2-adduct and the 1,4-adduct at a mass ratio of 1:3 to 3:1" means that in the molecular structure of the polybutadiene (B), the mass ratio between the amount of the branched constituent (derived from 1,2-addition) and the amount of the linear constituent (derived from 1,4-addition) is 1:3 to 3:1.

In the present embodiment, from the viewpoint of exhibiting better dielectric characteristics and heat resistance, the amount of the polybutadiene (B) is preferably 5 to 30 parts by mass, more preferably 15 to 30 parts by mass, and further preferably 20 to 30 parts by mass based on 100 parts by mass of the cyanate compound (A1).

[Cyanate Compound (A) and Polybutadiene (B) in Resin Composition]

The state of the cyanate compound (A) and the polybutadiene (B) present in the resin composition of the present embodiment is not particularly limited as long as it is different from a simple mixture of the cyanate compound (A) and the polybutadiene (B), and (i) the reactant of the cyanate compound (A) and the polybutadiene (B), and/or (ii) the reactant of a polymerized product of the cyanate compound (A) and the polybutadiene (B) is contained. Specific examples of one comprising cyanate compound (A) and polybutadiene (B) in such state include, but are not limited to, ULL-950S manufactured by Lonza.

Although not limited to the following, the reactant of the above (i) can be obtained by, for example, mixing the cyanate compound (A) and the polybutadiene (B) and then thermally polymerizing the mixture using various known radical initiators.

Although not limited to the following, the reactant of the above (ii) can be obtained by, for example, subjecting the cyanate compound (A) to a thermal polymerization or the like to form a polymerized product, mixing the polymerized product and the polybutadiene (B), and then thermally polymerizing the mixture similarly to the above using a radical initiator.

The state of the cyanate compound (A) and the polybutadiene (B) present in the resin composition can be confirmed by a nuclear magnetic resonance method, ultraviolet-visible spectroscopy, a gel permeation chromatograph, or the like.

It is considered that in the present embodiment, by using the above (i) and/or (ii), the compatibility between the components improves compared with a case where a simple mixture of the cyanate compound (A) and the polybutadiene (B) is used, and as a result, particularly, the balance of dielectric characteristics and heat resistance is to be excellent.

[Maleimide Compound (C)]

The maleimide compound (C) is not particularly limited as long as it is a compound having one or more maleimide groups in the molecule. Examples of the maleimide compound (C) include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, a maleimide compound (C1) represented by the following formula (1-1), a maleimide compound (C2) represented by the following formula (1-2), prepolymers of these maleimide compounds, or prepolymers of maleimide compounds and amine compounds. Among these, at least one selected from the group consisting of 2,2'-bis{4-(4-maleimidophenoxy)-phenyl}propane, bis(3-ethyl-5-methyl-4-maleimidophenyl)methane, the maleimide compound (C1) represented by the following formula (1-1), and the maleimide compound (C2) represented by the following formula (1-2) is preferred. When the resin composition of the present embodiment comprises such a maleimide compound (C), the thermal expansion coefficient of the obtained cured product tends to decrease more, and the glass transition temperature tends to be better. From a similar viewpoint, the maleimide compound (C) more preferably contains at least one selected from the group consisting of bis(3-ethyl-5-methyl-4-maleimidophenyl)methane, the maleimide compound (C1) represented by the following formula (1-1), and the maleimide compound (C2) represented by the following formula (1-2).

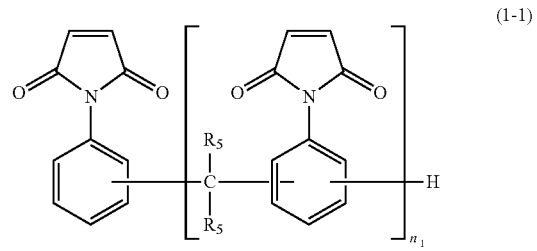

(1-1)

wherein $R_5$ each independently represents a hydrogen atom or a methyl group and preferably represents a hydrogen atom. In addition, in formula (1-1), $n_1$ represents an integer of 1 or more and is preferably an integer of 10 or less, more preferably an integer of 7 or less.

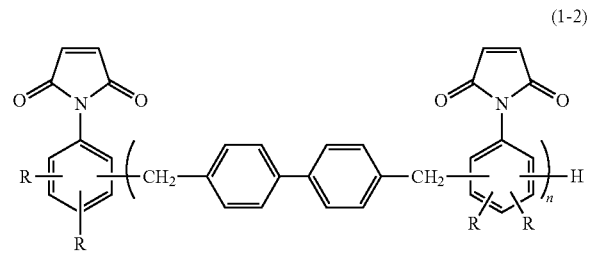

(1-2)

wherein the plurality of R each independently represent a hydrogen atom, an alkyl group having 1 to 5 carbon atoms (for example, a methyl group, an ethyl group, a n-propyl group, an isopropyl group, a n-butyl group, an isobutyl group, a t-butyl group, or a n-pentyl group), or a phenyl group. Among these, the plurality of R are each independently preferably a group selected from the group consisting of a hydrogen atom, a methyl group, and a phenyl group, more preferably one of a hydrogen atom and a methyl group, and further preferably a hydrogen atom from the viewpoint of even more improving flame resistance and peel strength.

In the above formula (1-2), n is an average value and satisfies $1<n\leq5$. n is preferably 4 or less, more preferably 3 or less, and further preferably 2 or less from the viewpoint of even better solvent solubility.

The polymaleimide compound represented by the above formula (1-2) may be prepared by a known method, and a commercial product may be used. Examples of the commercial product include, but are not limited to, a product of Nippon Kayaku Co., Ltd., "MIR-3000".

The content of the maleimide compound (C) in the present embodiment is preferably 10 to 70 parts by mass, more preferably 20 to 60 parts by mass, further preferably 25 to 50 parts by mass, and particularly preferably 35 to 50 parts by mass based on 100 parts by mass of the resin solid components. When the content of the maleimide compound (C) is in the above range, the thermal expansion coefficient of the obtained cured product tends to decrease more, and the heat resistance tends to improve more.

[Filler (D)]

The resin composition of the present embodiment preferably further comprises the filler (D) from the viewpoint of thermal expansion characteristics, dimensional stability, flame retardancy, and the like. As the filler (D), known ones can be appropriately used, and the type of the filler (D) is not particularly limited. Particularly, fillers generally used in laminate applications can be preferably used as the filler (D). Specific examples of the filler (D) include inorganic fillers such as silicas such as natural silica, fused silica, synthetic silica, amorphous silica, AEROSIL, and hollow silica, oxides such as white carbon, titanium white, zinc oxide, magnesium oxide, and zirconium oxide, boron nitride, aggregated boron nitride, silicon nitride, aluminum nitride, barium sulfate, metal hydrates such as aluminum hydroxide, heat-treated products of aluminum hydroxide (products obtained by heat-treating aluminum hydroxide to decrease some of the water of crystallization), boehmite, and magnesium hydroxide, molybdenum compounds such as molybdenum oxide and zinc molybdate, zinc borate, zinc stannate, alumina, clay, kaolin, talc, calcined clay, calcined kaolin, calcined talc, mica, E-glass, A-glass, NE-glass, C-glass, L-glass, D-glass, S-glass, M-glass G20, glass short fibers (including fine powders of glass such as E glass, T glass, D glass, S glass, and Q glass), hollow glass, and spherical glass as well as organic fillers such as rubber powders such as styrene-based rubber powders, butadiene-based rubber powders, and acrylic rubber powders, core-shell-based rubber powders, and silicone resin powders, silicone rubber powders, and silicone composite powders. One of these fillers can be used alone, or two or more of these fillers can be used in combination.

Among these, one or two or more selected from the group consisting of silica, aluminum hydroxide, boehmite, magnesium oxide, and magnesium hydroxide are preferred. By using these fillers, the characteristics, such as thermal expansion characteristics, dimensional stability, and flame retardancy, of the resin composition tend to improve more.

The content of the filler (D) in the resin composition of the present embodiment can be appropriately set according to the desired characteristics and is not particularly limited, but is preferably 50 to 1600 parts by mass, more preferably 50 to 750 parts by mass, further preferably 50 to 300 parts by mass, and particularly preferably 50 to 200 parts by mass when the content of the resin solid components is 100 parts by mass, from the viewpoint of the moldability of the resin composition.

Here, when the filler (D) is contained in the resin composition, a silane coupling agent and a wetting and dispersing agent are preferably used in combination. As the silane coupling agent, those generally used for surface treatment of inorganic matter can be preferably used, and the type of the silane coupling agent is not particularly limited. Specific examples of the silane coupling agent include, but are not limited to, aminosilane-based silane coupling agents such as γ-aminopropyltriethoxysilane and N-β-(aminoethyl)-γ-aminopropyltrimethoxysilane, epoxysilane-based silane coupling agents such as γ-glycidoxypropyltrimethoxysilane and β-(3,4-epoxycyclohexyl)ethyltrimethoxysilane, vinylsilane-based silane coupling agents such as γ-methacryloxypropyltrimethoxysilane and vinyl-tri(β-methoxyethoxy)silane, cationic silane-based silane coupling agents such as N-β-(N-vinylbenzylaminoethyl)-γ-aminopropyltrimethoxysilane hydrochloride, and phenylsilane-based silane coupling agents. One of these silane coupling agents can be used alone, or two or more of these silane coupling agents can be used in combination. In addition, as the wetting and dispersing agent, those generally used for paints can be preferably used, and the type of the wetting and dispersing agent is not particularly limited. As the wetting and dispersing agent, preferably, copolymer-based wetting and dispersing agents are used, and the wetting and dispersing agent may be a commercial product. Specific examples of the commercial product include, but are not limited to, Disperbyk-110, 111, 161, and 180, BYK-W996, BYK-W9010, BYK-W903, and BYK-W940 manufactured by BYK Japan KK. One of these wetting and dispersing agents can be used alone, or two or more of these wetting and dispersing agents can be used in combination.

[Other Components]

Further, the resin composition of the present embodiment may further contain an epoxy resin, a phenolic resin, an oxetane resin, a benzoxazine compound, a compound having a polymerizable unsaturated group, and the like in a range in which the expected characteristics are not impaired. By using these in combination, the desired characteristics, such as flame retardancy and low dielectric properties, of a cured product obtained by curing the resin composition tend to improve.

(Epoxy Resin)

As the epoxy resin, those generally known can be used as long as they are compounds having two or more epoxy groups in one molecule. The type of the epoxy resin is not particularly limited. Specific examples thereof include bisphenol A-based epoxy resins, bisphenol E-based epoxy resins, bisphenol F-based epoxy resins, bisphenol S-based epoxy resins, bisphenol A novolac-based epoxy resins, biphenyl-based epoxy resins, phenol novolac-based epoxy resins, cresol novolac-based epoxy resins, xylene novolac-based epoxy resins, polyfunctional phenol-based epoxy resins, naphthalene-based epoxy resins, naphthalene skeleton-modified novolac-based epoxy resins, naphthylene ether-based epoxy resins, phenol aralkyl-based epoxy resins, anthracene-based epoxy resins, trifunctional phenol-based epoxy resins, tetrafunctional phenol-based epoxy resins, triglycidyl isocyanurate, glycidyl ester-based epoxy resins, alicyclic epoxy resins, dicyclopentadiene novolac-based epoxy resins, biphenyl novolac-based epoxy resins, phenol aralkyl novolac-based epoxy resins, naphthol aralkyl novolac-based epoxy resins, aralkyl novolac-based epoxy resins, biphenyl aralkyl-based epoxy resins, naphthol aralkyl-based epoxy resins, dicyclopentadiene-based epoxy resins, polyol-based epoxy resins, phosphorus-containing epoxy resins, glycidyl amines, compounds obtained by epoxidizing double bonds of butadiene and the like, compounds obtained by reaction of hydroxyl group-containing silicone resins and epichlorohydrin, or halides thereof. One of these epoxy resins can be used alone, or two or more of these epoxy resins can be used in combination.

Among these, the epoxy resin is preferably one or more selected from the group consisting of a biphenyl aralkyl-based epoxy resin, a naphthylene ether-based epoxy resin, a polyfunctional phenol-based epoxy resin, and a naphthalene-based epoxy resin. When the resin composition of the present embodiment comprises such an epoxy resin, the flame retardancy and heat resistance of the obtained cured product tend to improve more.

(Phenolic Resin)

As the phenolic resin, those generally known can be used as long as they are phenolic resins having two or more hydroxyl groups in one molecule. Specific examples thereof include bisphenol A-based phenolic resins, bisphenol E-based phenolic resins, bisphenol F-based phenolic resins, bisphenol S-based phenolic resins, phenol novolac resins, bisphenol A novolac-based phenolic resins, glycidyl ester-based phenolic resins, aralkyl novolac-based phenolic resins, biphenyl aralkyl-based phenolic resins, cresol novolac-based phenolic resins, polyfunctional phenolic resins, naphthol resins, naphthol novolac resins, polyfunctional naphthol resins, anthracene-based phenolic resins, naphthalene skeleton-modified novolac-based phenolic resins, phenol aralkyl-based phenolic resins, naphthol aralkyl-based phenolic resins, dicyclopentadiene-based phenolic resins, biphenyl-based phenolic resins, alicyclic phenolic resins, polyol-based phenolic resins, phosphorus-containing phenolic resins, and hydroxyl group-containing silicone resins but are not particularly limited. Among these phenolic resins, biphenyl aralkyl-based phenolic resins, naphthol aralkyl-based phenolic resins, phosphorus-containing phenolic resins, and hydroxyl group-containing silicone resins are preferred in terms of flame retardancy. One of these phenolic resins can be used alone, or two or more of these phenolic resins can be used in combination.

(Oxetane Resin)

As the oxetane resin, those generally known can be used. Examples of the oxetane resin include oxetane, alkyloxetanes such as 2-methyloxetane, 2,2-dimethyloxetane, 3-methyloxetane, and 3,3-dimethyloxetane, 3-methyl-3-methoxymethyloxetane, 3,3-di(trifluoromethyl)perfluoxetane, 2-chloromethyloxetane, 3,3-bis(chloromethyl)oxetane, biphenyl-based oxetane, OXT-101 (trade name manufactured by Toagosei Co., Ltd.), and OXT-121 (trade name manufactured by Toagosei Co., Ltd.) but are not particularly limited. One of these oxetane resins can be used alone, or two or more of these oxetane resins can be mixed and used.

(Benzoxazine Compound)

As the benzoxazine compound, those generally known can be used as long as they are compounds having two or more dihydrobenzoxazine rings in one molecule. Examples of the benzoxazine compound include bisphenol A-based benzoxazine BA-BXZ (trade name manufactured by Konishi Chemical Ind. Co., Ltd.) bisphenol F-based benzoxazine BF-BXZ (trade name manufactured by Konishi Chemical Ind. Co., Ltd.), bisphenol S-based benzoxazine BS-BXZ (trade name manufactured by Konishi Chemical Ind. Co., Ltd.), P-d-based benzoxazine (trade name manufactured by SHIKOKU CHEMICALS CORPORATION), and F-a-based benzoxazine (trade name manufactured by SHIKOKU CHEMICALS CORPORATION) but are not particularly limited. One of these benzoxazine compounds can be used alone, or two or more of these benzoxazine compounds can be mixed and used.

(Compound Having Polymerizable Unsaturated Group)

As the compound having a polymerizable unsaturated group, those generally known can be used. Examples of the compound having a polymerizable unsaturated group include vinyl compounds such as ethylene, propylene, styrene, divinylbenzene, and divinylbiphenyl; (meth)acrylates of monohydric or polyhydric alcohols such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth)acrylates such as bisphenol A-based epoxy (meth)acrylate and bisphenol F-based epoxy (meth)acrylate; and benzocyclobutene resins; but are not particularly limited. One of these compounds having an unsaturated group can be used alone, or two or more of these compounds having an unsaturated group can be mixed and used. The above "(meth)acrylate" is a concept including acrylate and methacrylate corresponding to the acrylate.

(Curing Accelerator)

In addition, the resin composition of the present embodiment may contain a curing accelerator for appropriately adjusting the curing rate, as needed. As this curing accelerator, those generally used as curing accelerators for cyanate compounds, epoxy resins, and the like can be preferably used, and the type of the curing accelerator is not particularly limited. Specific examples of the curing accelerator include organometallic salts such as zinc octylate, zinc naphthenate, cobalt naphthenate, copper naphthenate, acetylacetone iron, nickel octylate, and manganese octylate, phenol compounds such as phenol, xylenol, cresol, resorcin, catechol, octyl phenol, and nonyl phenol, alcohols such as 1-butanol and 2-ethylhexanol, imidazoles such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole and derivatives such as adducts of carboxylic acids of these imidazoles or acid anhydrides thereof, amines such as dicyandiamide, benzyldimethylamine, and 4-methyl-N,N-dimethylbenzylamine, phosphorus compounds such as phosphine-based compounds, phosphine oxide-based compounds, phosphonium salt-based compounds, and diphosphine-based compounds, peroxides such as epoxy-imidazole adduct-based compounds, benzoyl peroxide, p-chlorobenzoyl peroxide, di-t-butyl peroxide, diisopropyl peroxycarbonate, and di-2-ethylhexyl peroxycarbonate, or azo compounds such as azobisisobutyronitrile, and N,N-dimethylaminopyridine. One of these curing accelerators can be used alone, or two or more of these curing accelerators can be used in combination.

The amount of the curing accelerator used can be appropriately adjusted considering the degrees of cure of the resins, the viscosity of the resin composition, and the like and is not particularly limited. The amount of the curing accelerator used may be 0.005 to 10 parts by mass based on 100 parts by mass of the resin solid components in the resin composition.

(Other Additives)

Further, various polymer compounds such as another thermosetting resin, a thermoplastic resin and an oligomer thereof, and an elastomer, a flame-retardant compound, various additives, and the like can be used in combination in the resin composition of the present embodiment in a range in which the expected characteristics are not impaired. These are not particularly limited as long as they are those generally used. Specific examples of the flame-retardant compound include, but not limited to, bromine compounds such as 4,4'-dibromobiphenyl, phosphates, melamine phosphate, phosphorus-containing epoxy resins, nitrogen compounds such as melamine and benzoguanamine, oxazine ring-containing compounds, and silicone-based compounds. In addition, examples of the various additives include, but not limited to, for example, ultraviolet absorbing agents, antioxidants, photopolymerization initiators, fluorescent brightening agents, photosensitizers, dyes, pigments, thickening agents, flow-adjusting agents, lubricants, defoaming agents, dispersing agents, leveling agents, brightening agents, and polymerization inhibitors. One of these can be used alone or two or more of these can be used in combination as desired.

(Organic Solvent)

The resin composition of the present embodiment can contain an organic solvent as needed. In this case, the resin composition of the present embodiment can be used as a form (solution or varnish) in which at least some, preferably all, of the above-described various resin components are dissolved in or compatible with the organic solvent. As the organic solvent, known ones can be appropriately used as long as they can dissolve or be compatible with at least some, preferably all, of the above-described various resin components. The type of the organic solvent is not particularly limited. Specific examples of the organic solvent include ketones such as acetone, methyl ethyl ketone, and methyl isobutyl ketone; cellosolve-based solvents such as propylene glycol monomethyl ether and propylene glycol monomethyl ether acetate; ester-based solvents such as ethyl lactate, methyl acetate, ethyl acetate, butyl acetate, isoamyl acetate, ethyl lactate, methyl methoxypropionate, and methyl hydroxyisobutyrate; and amides such as dimethylacetamide and dimethylformamide; and nonpolar solvents such as aromatic hydrocarbons such as toluene and xylene. One of these can be used alone, or two or more of these can be used in combination.

The resin composition of the present embodiment can be prepared according to an ordinary method, and the method for preparing the resin composition of the present embodiment is not particularly limited as long as it is a method in which a resin composition uniformly containing the cyanate compound (A), the polybutadiene (B), the maleimide compound (C), and the above-described other optional components is obtained. For example, the resin composition of the present embodiment can be easily prepared by sequentially blending the cyanate compound (A), the polybutadiene (B), the maleimide compound (C), and the above-described other optional components with a solvent and sufficiently stirring the blend.

During preparation of the resin composition, known treatment (stirring, mixing, and kneading treatment and the like) for uniformly dissolving or dispersing the components can be performed. For example, in uniform dispersion of the filler (D), by performing stirring and dispersion treatment using a stirring vessel provided with a stirrer having suitable stirring ability, the dispersibility in the resin composition is increased. The above stirring, mixing, and kneading treatment can be appropriately performed, for example, using a known apparatus such as an apparatus intended for mixing such as a ball mill or a bead mill, or a revolution-rotation mixing apparatus.

The resin composition of the present embodiment can be used as constituent materials of a prepreg, a metal foil-clad laminate, a printed wiring board, and a semiconductor package. For example, a prepreg can be obtained by impregnating or coating a base material with a solution of the resin composition of the present embodiment dissolved in a solvent and drying the solution.

In addition, a buildup film or a dry film solder resist can be obtained by using a peelable plastic film as a base material, coating the plastic film with a solution of the resin composition of the present embodiment dissolved in a solvent, and drying the solution. Here, the solvent can be dried by drying at a temperature of 20° C. to 150° C. for 1 to 90 minutes.

In addition, the resin composition of the present embodiment can also be used in an uncured state in which the solvent is only dried, or in a semi-cured (B-staged) state as needed.

A prepreg of the present embodiment will be described in detail below. The prepreg of the present embodiment comprises a base material; and the above resin composition with which the base material is impregnated or coated. The method for producing the prepreg of the present embodiment is not particularly limited as long as it is a method of combining the resin composition of the present embodiment and a base material to produce a prepreg. Specifically, the prepreg of the present embodiment can be produced by impregnating or coating a base material with the resin composition of the present embodiment and then semi-curing the resin composition by a method of drying in a dryer at 120 to 220° C. for about 2 to 15 minutes, or the like. At this time, the amount of the resin composition adhered to the base material, that is, the content of the resin composition (including the filler (D)) based on the total amount of the prepreg after the semi-curing, is preferably in the range of 20 to 99% by mass.

The base material used when the prepreg of the present embodiment is produced may be a known one used for various printed wiring board materials. Examples of such a base material include, but are not particularly limited to, woven fabrics of fibers of glass such as E glass, D glass, L glass, S glass, T glass, Q glass, UN glass, NE glass, and spherical glass, inorganic fibers of materials other than glass, such as quartz, organic fibers of polyimides, polyamides, polyesters, and the like, liquid crystal polyesters, and the like. As the shape of the base material, woven fabrics, nonwoven fabrics, rovings, chopped strand mats, surfacing mats, and the like are known, and the shape of the base material may be any of these. One of these base materials can be used alone, or two or more of these base materials can be used in appropriate combination. Among woven fabrics, particularly, woven fabrics subjected to ultra-opening treatment or clogging treatment are preferred from the viewpoint of dimensional stability. Further, glass woven fabrics surface-treated with silane coupling agents for epoxysilane treatment, aminosilane treatment, or the like are preferred from the viewpoint of moisture absorption heat resistance. In addition, liquid crystal polyester woven fabrics are preferred in terms of electrical characteristics. Further, the thickness of the base material is not particularly limited, but is preferably in the range of 0.01 to 0.2 mm in laminate applications.

A metal foil-clad laminate of the present embodiment comprises at least one or more of the above-described prepregs laminated; and metal foil disposed on one surface or both surfaces of the prepreg. Specifically, the metal foil-clad laminate of the present embodiment can be fabricated by disposing foil of a metal such as copper or aluminum on one surface or both surfaces of one of the above-described prepreg or a stack of a plurality of the prepregs and laminate-molding the metal foil and the prepreg or the stack. The metal foil used here is not particularly limited as long as it is one used for a printed wiring board material. Copper foil such as rolled copper foil and electrolytic copper foil is preferred. In addition, the thickness of the metal foil is not particularly limited but is preferably 2 to 70 μm, more preferably 3 to 35 μm. As the molding conditions, methods used when usual laminates and multilayer boards for printed wiring boards are fabricated can be adopted. For example, the metal foil-clad laminate of the present embodiment can be produced by laminate-molding under the conditions of a temperature of 180 to 350° C., a heating time of 100 to 300 minutes, and a surface pressure of 20 to 100 kg/cm² using a multistage press, a multistage vacuum press, a continuous molding machine, an autoclave molding machine, or the like. In addition, a multilayer board can also be fabricated by laminate-molding the above prepreg and a separately fabricated wiring board for an inner layer in combination. As the method for producing a multilayer board, for example, 35 μm copper foil is disposed on both surfaces of one of the above-described prepreg, the copper foil and the prepreg are laminated and formed under the above conditions, then inner layer circuits are formed, and these circuits are subjected to blackening treatment to form an inner layer circuit board. Further, these inner layer circuit boards and the above prepregs are alternately disposed one by one, copper foil is further disposed on the outermost layers, and the copper foil, the inner layer circuit boards, and the prepregs are laminate-molded under the above conditions preferably under vacuum. Thus, a multilayer board can be fabricated.

The metal foil-clad laminate of the present embodiment can be preferably used as a printed wiring board by further forming a pattern. The printed wiring board can be produced according to an ordinary method, and the method for producing the printed wiring board is not particularly limited. One example of a method for producing a printed wiring board will be shown below. First, the above-described metal foil-clad laminate is provided. Next, the surfaces of the metal foil-clad laminate are subjected to etching treatment to form inner layer circuits to fabricate an inner layer board. The inner layer circuit surfaces of this inner layer board are subjected to surface treatment for increasing adhesive strength, as needed, and then the required number of the above-described prepregs are stacked on the inner layer circuit surfaces. Further, metal foil for outer layer circuits is laminated on the outside of the stack, and heat and pressure are applied for integral molding. In this manner, a multilayer laminate in which insulating layers comprising a base material and a cured product of a thermosetting resin composition are formed between inner layer circuits and metal foil for outer layer circuits is produced. Then, this multilayer laminate is subjected to perforation for through holes and via holes, and then plating metal films that allow conduction between the inner layer circuits and the metal foil for outer layer circuits are formed on the wall surfaces of these holes. Further, the metal foil for outer layer circuits is subjected to etching treatment to form outer layer circuits. Thus, a printed wiring board is produced.

The printed wiring board obtained in the above production example has a configuration in which it has insulating layers and conductor layers formed on surfaces of these insulating layers, and the insulating layers comprise the resin composition of the present embodiment described above. In other words, the prepreg of the present embodiment described above (the base material and the resin composition of the present embodiment with which the base material is impregnated or coated) and the resin composition layer of the metal foil-clad laminate of the present embodiment described above (the layer comprising the resin composition of the present embodiment) are composed of an insulating layer comprising the resin composition of the present embodiment.

A resin sheet of the present embodiment refers to a support and the above resin composition layer disposed on a surface of the support (laminated sheet) and also refers to only the resin composition layer obtained by removing the support (single-layer sheet). In other words, the resin sheet of the present embodiment has at least the resin composition of the present embodiment. This laminated sheet can be obtained by coating a support with a solution of the above resin composition dissolved in a solvent and drying the solution. The support used here is not particularly limited. Examples thereof include organic film base materials such as polyethylene films, polypropylene films, polycarbonate films, polyethylene terephthalate films, ethylene-tetrafluoroethylene copolymer films, and release films obtained by coating surfaces of these films with release agents, and polyimide films, conductor foil such as copper foil and aluminum foil, and plate-shaped inorganic films such as glass plates, SUS plates, and FRP. Examples of the coating method include a method of fabricating a laminated sheet in which a support and a resin composition layer are integrated, by coating a support with a solution of the above resin composition dissolved in a solvent by a bar coater, a die coater, a doctor blade, a baker applicator, or the like. In addition, a single-layer sheet can also be obtained by peeling or etching the support from the resin sheet obtained by further drying after the coating. A single-layer sheet can also be obtained without using a support by supplying a solution of the above resin composition in the present embodiment dissolved in or made compatible with a solvent into a mold having a sheet-shaped cavity, and drying the solution, or the like for molding into a sheet shape.

In fabrication of the resin sheet or the single-layer sheet in the present embodiment, the drying conditions when the solvent is removed are not particularly limited, but drying is preferably performed at a temperature of 20° C. to 200° C. for 1 to 90 minutes. At 20° C. or more, remaining of the solvent in the resin composition can be more prevented, and at 200° C. or less, progress of curing of the resin composition can be suppressed. In addition, the thickness of the resin layer in the resin sheet or the single-layer sheet in the present embodiment can be adjusted by the concentration and coating thickness of the solution of the resin composition of the present embodiment and is not particularly limited. However, the thickness is preferably 0.1 to 500 μm. When the thickness of the resin layer is 500 μm or less, the solvent is even less likely to remain during drying.

EXAMPLES

The present embodiment will be more specifically described below using an Example and a Comparative Example. The present embodiment is not limited in any way by the following Example.

[Synthesis Example 1] Synthesis of Naphthol Aralkyl-Based Cyanate Resin (SNCN)

300 g (1.28 mol in terms of OH groups) of a 1-naphthol aralkyl resin (manufactured by NIPPON STEEL & SUMIKIN CHEMICAL CO., LTD.) and 194.6 g (1.92 mol) (1.5 mol based on 1 mol of hydroxy groups) of triethylamine were dissolved in 1800 g of dichloromethane to thereby obtain solution 1.

While 125.9 g (2.05 mol) (1.6 mol based on 1 mol of hydroxy groups) of cyanogen chloride, 293.8 g of dichloromethane, 194.5 g (1.92 mol) (1.5 mol based on 1 mol of hydroxy groups) of 36% hydrochloric acid, and 1205.9 g of water were kept at a liquid temperature of −2 to −0.5° C. under stirring, the solution 1 was poured over 30 minutes. After completion of pouring of the solution 1, the mixture was stirred at the same temperature for 30 minutes, and then a solution of 65 g (0.64 mol) (0.5 mol based on 1 mol of hydroxy groups) of triethylamine dissolved in 65 g of dichloromethane (solution 2) was poured over 10 minutes. After completion of pouring of the solution 2, the mixture was stirred at the same temperature for 30 minutes to complete the reaction.

Then, the reaction liquid was allowed to stand to separate the organic phase and the aqueous phase. The obtained organic phase was washed five times with 1300 g of water. The electrical conductivity of the wastewater from the fifth water washing was 5 μS/cm, and it was confirmed that removable ionic compounds were sufficiently removed by the washing with water.

The organic phase after the water washing was concentrated under reduced pressure and finally concentrated to dryness at 90° C. for 1 hour to obtain 331 g of the target naphthol aralkyl-based cyanate compound (SNCN) (orange viscous material). The mass average molecular weight Mw of the obtained SNCN was 600. In addition, the IR spectrum of SNCN showed absorption at 2250 $cm^{-1}$ (cyanate groups) and showed no absorption of hydroxy groups.

[Synthesis Example 2] Synthesis of 1,1-Bis(4-cyanatophenyl)ethane (Bisphenol E-Based Cyanate)

300 g (2.80 mol in terms of OH groups) of 1,1-bis(4-hydroxyphenyl)ethane (manufactured by TOKYO CHEMICAL INDUSTRY CO., LTD.) and 283.4 g (2.80 mol) (1.0 mol based on 1 mol of hydroxy groups) of triethylamine were dissolved in 1800 g of dichloromethane to thereby obtain solution 3.

While 275.4 g (4.48 mol) (1.6 mol based on 1 mol of hydroxy groups) of cyanogen chloride, 642.6 g of dichloromethane, 425.4 g (4.20 mol) (1.5 mol based on 1 mol of hydroxy groups) of 36% hydrochloric acid, and 2637.6 g of water were kept at a liquid temperature of −2 to −0.5° C. under stirring, the solution 3 was poured over 60 minutes. After completion of pouring of the solution 3, the mixture was stirred at the same temperature for 30 minutes, and then a solution of 283.4 g (2.80 mol) (1.0 mol based on 1 mol of hydroxy groups) of triethylamine dissolved in 283.4 g of dichloromethane (solution 4) was poured over 30 minutes. After completion of pouring of the solution 4, the mixture was stirred at the same temperature for 30 minutes to complete the reaction.

Then, the reaction liquid was allowed to stand to separate the organic phase and the aqueous phase. The obtained organic phase was washed five times with 1300 g of water. The electrical conductivity of the wastewater from the fifth water washing was 20 μS/cm, and it was confirmed that removable ionic compounds were sufficiently removed by the washing with water. The organic phase after the water washing was concentrated under reduced pressure and finally concentrated to dryness at 90° C. for 1 hour to obtain 360 g of the target cyanate compound. The structure of the obtained cyanate compound was identified by NMR.

$^1$H-NMR: (270 MHz, chloroform-d, internal standard TMS) δ (ppm)=1.62 (d, 3H), 4.22 (q, 1H), 7.42 (complex, 8H)

Example 1

50.0 parts by mass of the reactant of 82.7% by mass of a bisphenol A-based cyanate and 17.3% by mass of unmodified polybutadiene (manufactured by Lonza; ULL-950S; comprising 64% by mass of the 1,2-adduct and 36% by mass of the 1,4-adduct in polybutadiene), 50.0 parts by mass of a novolac-based bismaleimide compound (manufactured by Daiwa Kasei Co., Ltd., BMI-2300), 100.0 parts by mass of epoxysilane-treated fused silica (SC2050 MB, manufactured by Admatechs Company Limited), and 0.10 parts by mass of zinc octylate (manufactured by Nihon Kagaku Sangyo Co., Ltd.) were mixed and diluted with methyl ethyl ketone to obtain a varnish.

Comparative Example 1

50.0 parts by mass of a bisphenol A-based cyanate (manufactured by MITSUBISHI GAS CHEMICAL COMPANY, INC., trade name "CA210"), 50.0 parts by mass of a novolac-based bismaleimide compound (manufactured by Daiwa Kasei Co., Ltd., BMI-2300), 100.0 parts by mass of epoxysilane-treated fused silica (SC2050 MB, manufactured by Admatechs Company Limited), and 0.10 parts by mass of zinc octylate (manufactured by Nihon Kagaku Sangyo Co., Ltd.) were mixed and diluted with methyl ethyl ketone to obtain a varnish.

Comparative Example 2

50.0 parts by mass of the SNCN produced in Synthesis Example 1, 50.0 parts by mass of a novolac-based bismaleimide compound (manufactured by Daiwa Kasei Co., Ltd., BMI-2300), 100.0 parts by mass of epoxysilane-treated fused silica (SC2050 MB, manufactured by Admatechs Company Limited), and 0.15 parts by mass of zinc octylate (manufactured by Nihon Kagaku Sangyo Co., Ltd.) were mixed and diluted with methyl ethyl ketone to obtain a varnish.

Comparative Example 3

50.0 parts by mass of the bisphenol E-based cyanate obtained in Synthesis Example 2, 50.0 parts by mass of a novolac-based bismaleimide compound (manufactured by Daiwa Kasei Co., Ltd., BMI-2300), 100.0 parts by mass of epoxysilane-treated fused silica (SC2050 MB, manufactured by Admatechs Company Limited), and 0.10 parts by mass of zinc octylate (manufactured by Nihon Kagaku Sangyo Co., Ltd.) were mixed and diluted with methyl ethyl ketone to obtain a varnish.

[Method for Producing Copper-Clad Laminate]

E-glass clothes having a thickness of 0.1 mm were impregnated and coated with the varnishes obtained as described above, and heated and dried at 165° C. for 4 minutes using a dryer (pressure-resistant explosion-proof steam dryer, manufactured by TAKASUGI MFG. Co. Ltd.)), to obtain each prepreg comprising 46% by mass of a resin composition. Eight of these prepregs were stacked, and 12 μm copper foil (3EC-M3-VLP, manufactured by MITSUI MINING & SMELTING CO., LTD.) was disposed on both surfaces. The stack was vacuum-pressed at a pressure of 40 kg/cm$^2$ and a temperature of 230° C. for 120 minutes to obtain a 12 μm copper-clad laminate having a thickness of 0.8 mm. The following evaluation was performed using the obtained copper-clad laminate.

[Dielectric Constants (Dk)]

The dielectric constants at 2 GHz and 10 GHz were measured by a cavity resonator perturbation method (Agilent 8722ES, manufactured by Agilent Technologies) using test pieces (n=3) obtained by removing the copper foil of the copper-clad laminate, and the average value of three measurements was obtained for each.

[Dielectric Loss Tangents (Df)]

The dielectric loss tangents at 2 GHz and 10 GHz were measured by a cavity resonator perturbation method (Agilent 8722ES, manufactured by Agilent Technologies) using test pieces (n=3) obtained by removing the copper foil of the copper-clad laminate, and the average value of three measurements was obtained for each.

[Heat Resistance Evaluation]

The obtained copper foil-clad laminate was cut to a size of 12.7×30 mm by a dicing saw, and then the copper foil on the surfaces was removed by etching to obtain a measurement sample. The storage modulus E' and the loss modulus E" were measured by a dynamic viscoelasticity analyzer (manufactured by TA Instruments) by a DMA method in accordance with JIS C6481 using this measurement sample, and the heat resistance was evaluated with each of the values of the peaks of E" and tan δ (=E"/E') taken as Tg.

TABLE 1

| | | | Example 1 | Comparative Example 1 | Comparative Example 2 | Comparative Example 3 |
|---|---|---|---|---|---|---|
| Dielectric property | Dk (2 GHz) | | 4.25 | 4.59 | 4.92 | 4.92 |
| | Df (2 GHz) | | 0.005 | 0.006 | 0.006 | 0.005 |
| | Dk (10 GHz) | | 4.16 | 4.43 | 4.74 | 4.70 |
| | Df (10 GHz) | | 0.006 | 0.008 | 0.008 | 0.007 |
| Glass-transition temperature [Tg] | E" | [° C.] | 312 | 290 | 289 | 283 |
| | tan δ | [° C.] | 307 | 294 | 296 | 291 |

INDUSTRIAL APPLICABILITY

The resin composition of the present invention has industrial applicability as materials of a prepreg, a metal foil-clad laminate, a laminated resin sheet, a resin sheet, a printed wiring board, and the like.

The invention claimed is:
1. A resin composition comprising:
(i) a reactant of a cyanate compound (A) and a polybutadiene (B) and/or (ii) a reactant of a polymerized product of the cyanate compound (A) and the polybutadiene (B); and a maleimide compound (C),
wherein the maleimide compound (C) comprises at least one selected from a group consisting of 2,2'-bis{4-(4-maleimidophenoxy)-phenyl}propane, bis(3-ethyl-5-methyl-4-maleimidophenyl)methane, a maleimide compound (C1) represented by the following formula (1-1), and a maleimide compound (C2) represented by the following formula (1-2),

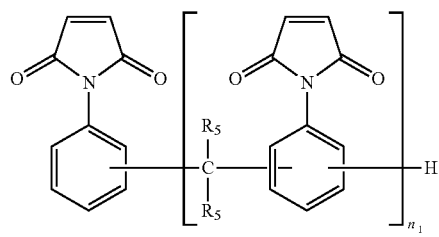

(1-1)

wherein $R_5$ each independently represents a hydrogen atom or a methyl group, and $n_1$ represents an integer of 1 or more,

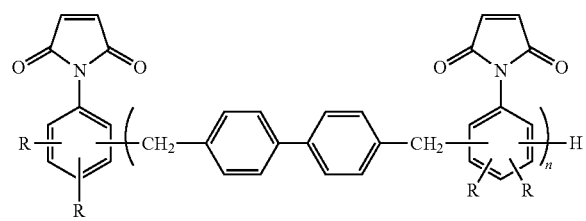

(1-2)

wherein a plurality of R each independently represent a hydrogen atom, an alkyl group having 1 to 5 carbon atoms, or a phenyl group, and n is an average value and satisfies 1<n≤5, and
wherein the polybutadiene (B) is an unmodified polybutadiene, and wherein the polybutadiene (B) comprises a 1,2-adduct and a 1,4-adduct at a mass ratio of 1:3 to 3:1.

2. The resin composition according to claim 1, wherein the cyanate compound (A) comprises at least one cyanate compound (A1) selected from a group consisting of a bisphenol A-based cyanate compound, a bisphenol E-based cyanate compound, a bisphenol F-based cyanate compound, and a novolac-based cyanate compound.

3. The resin composition according to claim 2, wherein the cyanate compound (A) further comprises a cyanate compound (A2) other than the cyanate compound (A1).

4. The resin composition according to claim 2, wherein an amount of the polybutadiene (B) is 5 to 30 parts by mass based on 100 parts by mass of the cyanate compound (A1).

5. The resin composition according to claim 1, wherein the polybutadiene (B) comprises a 1,2-adduct and a 1,4-adduct at a mass ratio of 1:1 to 3:1.

6. The resin composition according to claim 1, wherein a content of the cyanate compound (A) in the resin composition is 1 to 90 parts by mass based on 100 parts by mass of resin solid components.

7. The resin composition according to claim 1, wherein the maleimide compound (C) contains at least one selected from a group consisting of bis(3-ethyl-5-methyl-4-maleimidophenyl)methane, a maleimide compound (C1) represented by the following formula (1-1), and a maleimide compound (C2) represented by the following formula (1-2),

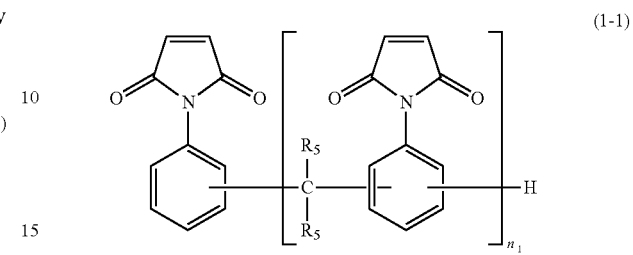

(1-1)

wherein $R_5$ each independently represents a hydrogen atom or a methyl group, and $n_1$ represents an integer of 1 or more,

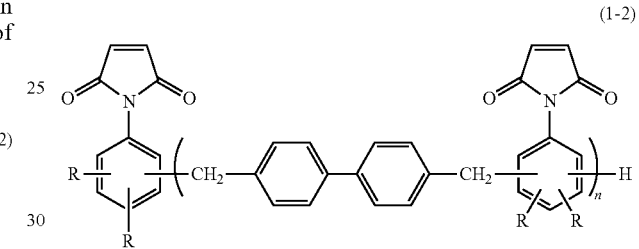

(1-2)

wherein a plurality of R each independently represent a hydrogen atom, an alkyl group having 1 to 5 carbon atoms, or a phenyl group, and n is an average value and satisfies 1<n≤5.

8. The resin composition according to claim 1, further comprising a filler (D).

9. The resin composition according to claim 8, wherein a content of the filler (D) in the resin composition is 50 to 1600 parts by mass based on 100 parts by mass of the resin solid components.

10. The resin composition according to claim 1, further comprising any one or more of a group selected from an epoxy resin, a phenolic resin, an oxetane resin, a benzoxazine compound, and a compound having a polymerizable unsaturated group.

11. A prepreg comprising:
a base material; and
the resin composition according to claim 1, with which the base material is impregnated or coated.

12. A metal foil-clad laminate comprising:
at least one or more of the prepregs according to claim 11 laminated; and
a metal foil disposed on one surface or both surfaces of the prepreg.

13. A resin sheet comprising the resin composition according to claim 1.

14. A printed wiring board comprising:
an insulating layer; and
a conductor layer formed on a surface of the insulating layer, wherein the insulating layer comprises the resin composition according to claim 1.

* * * * *